United States Patent
Matolin et al.

(10) Patent No.: US 9,967,479 B2
(45) Date of Patent: May 8, 2018

(54) DYNAMIC, SINGLE PHOTODIODE PIXEL CIRCUIT AND OPERATING METHOD THEREOF

(71) Applicant: CHRONOCAM, Paris (FR)

(72) Inventors: Daniel Matolin, Freital (DE); Christoph Posch, Bad Fischau (AT)

(73) Assignee: CHRONOCAM (FR)

( * ) Notice: Subject to any disclaimer, the term of this patent is extended or adjusted under 35 U.S.C. 154(b) by 59 days.

(21) Appl. No.: 15/022,319

(22) PCT Filed: Sep. 15, 2014

(86) PCT No.: PCT/EP2014/069611
§ 371 (c)(1),
(2) Date: Mar. 16, 2016

(87) PCT Pub. No.: WO2015/036592
PCT Pub. Date: Mar. 19, 2015

(65) Prior Publication Data
US 2016/0227135 A1    Aug. 4, 2016

(30) Foreign Application Priority Data
Sep. 16, 2013   (EP) .................................. 13306260

(51) Int. Cl.
*H04N 5/355*    (2011.01)
*H04N 5/3745*   (2011.01)
(Continued)

(52) U.S. Cl.
CPC ............ *H04N 5/355* (2013.01); *H04N 3/155* (2013.01); *H04N 5/2351* (2013.01);
(Continued)

(58) Field of Classification Search
USPC .................. 348/221.1–230.1, 297–324, 362
See application file for complete search history.

(56) References Cited

U.S. PATENT DOCUMENTS 6,253,161 B1   6/2001   Arias-Estrada
7,728,269 B2   6/2010   Lichtsteiner et al.
(Continued)

FOREIGN PATENT DOCUMENTS

JP        06313840 A  * 11/1994
WO        2006078861 A2   7/2006

OTHER PUBLICATIONS

International Search Report for Application No. PCT/EP2014/069611 dated Jan. 12, 2015.
(Continued)

*Primary Examiner* — Roberto Velez
*Assistant Examiner* — Quan Pham
(74) *Attorney, Agent, or Firm* — Lerner, David, Littenberg, Krumholz & Mentlik, LLP

(57) ABSTRACT

The invention relates to pixel circuit and an operating method thereof, comprising
- a front-end circuit comprising a single photodiode and having an output, said front-end circuit being configured for delivering on said output a photoreceptor signal derived from a light exposure of said single photodiode;
- a transient detector circuit configured for detecting a change in said photoreceptor signal delivered on said output;
- an exposure measurement circuit configured for measuring said photoreceptor signal delivered on said output upon detection by the transient detector circuit of a change in the photoreceptor signal.

The invention also relates to an image sensor comprising a plurality of pixel circuits.

8 Claims, 6 Drawing Sheets

(51) Int. Cl.
- *H04N 5/335* (2011.01)
- *H04N 5/235* (2006.01)
- *H04N 5/378* (2011.01)
- *H04N 3/14* (2006.01)
- *H01L 27/146* (2006.01)

(52) U.S. Cl.
CPC ............. *H04N 5/335* (2013.01); *H04N 5/378* (2013.01); *H04N 5/3745* (2013.01); *H01L 27/14609* (2013.01)

(56) References Cited

U.S. PATENT DOCUMENTS

| | | | |
|---|---|---|---|
| 2003/0218118 A1 | 11/2003 | Kramer et al. | |
| 2008/0169422 A1* | 7/2008 | Shahar | G01T 1/2928 250/370.09 |
| 2009/0321616 A1* | 12/2009 | Miyake | G01J 1/32 250/214 AL |
| 2010/0182468 A1 | 7/2010 | Posch et al. | |
| 2014/0326854 A1* | 11/2014 | Delbruck | H04N 5/378 250/204 |

OTHER PUBLICATIONS

International Preliminary Report on Patentability for Application No. PCT/EP2014/069611 dated Feb. 4, 2016.

Written Opinion for Application No. PCT/EP2014/069611 dated Jan. 12, 2015.

Lichtsteiner, Patrick et al: "A 128×128 120 dB 15 ?s Latency Asynchronous Temporal Contrast Vision Sensor", IEEE Journal of Solid-State Circuits, IEEE Service Center, Piscataway, NJ, USA, vol. 43, No. 2, Feb. 1, 2008 (Feb. 1, 2008), pp. 566-576, XP011200748, ISSN: 0018-9200.

Delbruck, Tobi: "Frame-free dynamic digital vision", Proceedings of the International Conference on Secure-Life Electronics, Advanced Electronics for Quality Life and Society, Mar. 7, 2008 (Mar. 7, 2008), pp. 21-26, XP055035734, University of Tokyo, the whole document.

C. Posch, D. Matolin and R. Wohlgenannt "A Two-Stage Capacitive-Feedback Differencing Amplifier Temporal Contrast IR Sensors" Analog Integrated Circuits and Signal Processing Journal vol. 64, No. 1 pp. 45-54 Jul. 2010.

* cited by examiner

DYNAMIC, SINGLE PHOTODIODE PIXEL CIRCUIT AND OPERATING METHOD THEREOF

CROSS REFERENCE TO RELATED APPLICATIONS

The present application is a national phase entry under 35 U.S.C. § 371 of International Application No. PCT/EP2014/069611, filed Sep. 15, 2014, published in English, which claims priority from European Patent Application No. 13306260.4, filed Sep. 16, 2013, the disclosures of which are incorporated by reference herein.

CONTEXT AND BACKGROUND OF THE INVENTION

The invention relates to a pixel circuit for an image sensor. More specifically, it relates to a pixel circuit and an operating method thereof, wherein an exposure measurement circuit is configured for measuring the light exposure intensity from a photoreceptor signal derived from a light exposure of a single photoreceptor, upon detection by a transient detector circuit of a change in said photoreceptor signal.

Conventional image sensors acquire the visual information time-quantized at a predetermined frame rate. Each frame carries the information from all pixels, regardless of whether or not this information has changed since the last frame has been acquired. This approach obviously results, depending on the dynamic contents of the scene, in a more or less high degree of redundancy in the recorded image data. The problem worsens as modern image sensors advance to ever higher spatial and temporal resolution. The hardware required for post-processing of the data increases in complexity and cost, demand on transmission bandwidth and data storage capacity surges and the power consumption rises, leading to severe limitations in all kinds of vision applications, from demanding high-speed industrial vision systems to mobile, battery-powered consumer devices.

One approach to dealing with temporal redundancy in video data is frame difference encoding. This simplest form of video compression includes transmitting only pixel values that exceed a defined intensity change threshold from frame to frame after an initial key-frame. Known frame differencing imagers rely on acquisition and processing of full frames of image data and are not able to self-consistently suppress temporal redundancy and provide real-time compressed video output. Furthermore, even when the processing and difference quantization is done at the pixel-level, the temporal resolution of the acquisition of the scene dynamics, as in all frame-based imaging devices, is still limited to the achievable frame rate and is time-quantized to this frame rate.

The adverse effects of data redundancy are most effectively avoided by not recording the redundant data in the first place and directly reducing data volume at the sensor output level. The immediate benefits are reductions in bandwidth, memory and computing power requirements for data transmission and post-processing, hence decreasing system power, complexity and cost. In addition, the frame-based, clocked principle of operation of conventional CMOS or CCD image sensors leads to limitations in temporal resolution as scene dynamics are quantized to the frame rate at which the pixel field of view is read out, and poor dynamic range.

The problem to be solved by the present invention is to provide a method and an apparatus for the continuous acquisition of the full visual information of an observed dynamic scene with high temporal and intensity resolution, over a wide dynamic range (of recordable and processable light intensity) and thereby generating the minimum necessary amount of data volume. Thus, the generated data are not constituted by a succession of frames containing the image information of all pixels, but an (asynchronous) stream of change and intensity (i.e. grey level) information of individual pixels, which are recorded and transmitted only if an actual change in light intensity in the field of view of the individual pixel has been detected by the pixel itself.

This method leads to a substantial reduction of generated data through complete suppression of the temporal redundancy in the picture information that is typical for conventional image sensors, though with the data containing the same, or even higher, information content. The picture element for an image sensor that implements the aforementioned method as well as the required asynchronous data readout mechanism can be realized on basis of analogue electronic circuits. An image sensor with a multiplicity of such picture elements is typically realized and fabricated as an integrated system-on-chip e.g. in CMOS technology.

Implementing such a sensor and thus avoiding the above mentioned drawbacks of conventional image data acquisition would be beneficial for a wide range of artificial vision applications including industrial high-speed vision (e.g. fast object recognition, motion detection and analysis, object tracking, etc.), automotive (e.g. real-time 3D stereo vision for collision warning and avoidance, intelligent rear-view mirrors, etc.), surveillance and security (scene surveillance) or robotics (autonomous navigation, SLAM) as well as biomedical and scientific imaging applications. As the sensor operation is inspired by working principles of the human retina, one advantageous example application is the treatment of a degenerated retina of a blind patient with an implantable prosthesis device based on the data delivered by such a sensor.

A solution for achieving the aforementioned complete temporal redundancy suppression is based on pixel-individual pre-processing and acquiring of the image information, event-controlled (i.e. independently of external timing control such as clock, shutter or reset signals) and conditionally (i.e. only when changes in the scene have been detected). As explained below, the control of the image data acquisition is transferred to the pixel-level and can be done at very high temporal resolution (e.g. fully asynchronously).

In the case of the optical transient sensor, or dynamic vision sensor (DVS), changes in lighting intensity received by the individual, autonomously operating pixels are detected by an electronic circuit, "a transient detector", described in U.S. Pat. No. 7,728,269.

U.S. patent application US 2010/0182468 A1 discloses combining transient detector circuits, i.e. light exposure intensity changes detector circuits, and conditional exposure measurement circuits. A transient detector circuit individually and asynchronously initiates the measurement of a new exposure measure only if—and immediately after—a brightness change of a certain magnitude has been detected in the field-of-view of a pixel. Such a pixel does not rely on external timing signals and independently requests access to an (asynchronous and arbitrated) output channel only when it has a new grayscale value to communicate. Consequently, a pixel that is not stimulated visually does not produce output. In addition, the asynchronous operation avoids the time quantization of frame-based acquisition and scanning readout.

For each pixel, the transient detector circuit monitors a photoreceptor voltage derived from a first photodiode for detecting relative voltage changes that exceed a threshold. Upon such detection, the transient detector circuit outputs a command for the exposure measurement circuit of the same pixel to start an absolute intensity measurement, i.e. an absolute grey level measurement. The exposure measurement circuit uses a second photodiode of the pixel, placed adjacent to the first photodiode, and derives its measure from the time duration for discharging the photodiode junction capacitance with the instantaneous photocurrent.

However, the pixel circuit disclosed in US 2010/0182468 A1 is not optimal since it consumes a large area for a pixel element and thus cannot achieve high resolution. Furthermore, time-based exposure measurement through direct photocurrent integration often leads to a prohibitively long measurement time of a new exposure value, especially at low pixel illuminance levels, due to the corresponding small photocurrents. Finally using two separate photodiodes for change detection and exposure measurement leads to spatial divergence and motion direction dependency of the image data acquisition process, resulting in a reduction in imaging quality.

SUMMARY OF THE INVENTION

The invention aims at providing a pixel circuit with smaller area requirements, allowing for larger array sizes or smaller sensor chip dimensions. The invention also aims at speeding up the individual measurement processes and consequently increasing temporal resolution. Furthermore, the invention aims at avoiding spatial divergence between change detection and exposure measurement caused by a use of two separate photodiodes, improving measurement accuracy and consequently image quality.

In this respect, the invention relates to a pixel circuit comprising:
 a front-end circuit comprising a single photodiode and having an output, said front-end circuit being configured for delivering on said output a photoreceptor signal derived from a light exposure of said single photodiode;
 a transient detector circuit configured for detecting a change in said photoreceptor signal delivered on said output;
 an exposure measurement circuit configured for measuring said photoreceptor signal delivered on said output upon detection by the transient detector circuit of a change in the photoreceptor signal.

In contrast to the prior art circuits wherein exposure changes were detected on a photodiode and exposure measurements were made on another photodiode, the proposed pixel circuit requires only one photodiode per pixel. Accordingly, the surface consumption of the pixel element can be reduced significantly, allowing for larger array sizes or smaller sensor chip dimensions. Resolution can also be increased. Also, the spatial divergence between change detection and exposure measurement is avoided, improving measurement accuracy and consequently image quality. Very advantageously, the duration of a grey level measurement can be significantly reduced as explained below, significantly improving the temporal resolution of the image data acquisition process.

Other preferred, although non limitative, aspects of the pixel circuit are as follows, isolated or in a technically feasible combination:
 the exposure measurement circuit comprises
  an input connected to the output of the front-end circuit for receiving the photoreceptor signal,
  a capacitor connected by a first switch to said input, said first switch being configured for disconnecting said capacitor from said input,
  a source current in series with a second switch, parallel to said capacitor, said second switch being configured for controlling a discharge of said capacitor;
 the exposure measurement circuit comprises a voltage comparator having a signal input connected to one of the terminal of the capacitor and a reference input connected to a reference voltage;
 the voltage comparator has:
  a signal input connected to one of the terminal of the capacitor and
  a reference input connected to reference switch configured for selectively connecting said reference input to at least two reference voltages;
 the transient detector circuit comprises an amplifier having two single-ended inverting common-source stages with capacitive feedback separated by a follower buffer wherein a first capacitor is charged by means of the photoreceptor signal, and at least one threshold detector is arranged to detect if a voltage over another capacitor exceeds a threshold value;
 the front-end circuit comprises a photoreceptor circuit connected to the single diode, the photoreceptor circuit comprises:
  an output for delivering the photoreceptor signal derived from the light exposure of said single photodiode,
  a first photoreceptor transistor having a drain and a gate, the gate of said first photoreceptor transistor being connected to said output,
  an additional photoreceptor transistor having a drain, a source and a gate, the source of said additional photoreceptor transistor being connected to said single photodiode and,
 wherein said first and additional photoreceptor transistors have a common source;
 the gate of additional photoreceptor transistor is biased by a biasing voltage or is connected to the common source of the first and additional photoreceptor transistors;
 the front-end circuit further comprises a gain stage for amplifying the photoreceptor signal delivered on the output of the front-end circuit, said gain stage comprising:
  an input connected to the output of a photoreceptor circuit,
  an output,
  a first gain transistor having a drain, a source and a gate, the gate of the first gain transistor being connected to the input of the gain stage, the source of the first gain transistor being connected to a biasing voltage and the drain of said first gain transistor being connected to the output of said gain stage, and
  a plurality of gain transistors in series, each gain transistor of the series having a drain, a source and a gate, each gain transistors of the series having its drain connected to its gate, and one of said plurality of gain transistors in series having its drain connected to the drain of the first gain transistor.

The invention also relates to an image sensor comprising a plurality of pixel circuits according to a possible embodiment of the invention.

The invention also relates to a method for operating a pixel circuit according to one of the possible embodiment of the invention, wherein a light exposure measurement cycle of a photodiode by means of the exposure measurement circuit is initiated by detection by the transient detector circuit of a change in the photoreceptor signal derived from the intensity of the incident light at said photodiode.

Other preferred, although non limitative, aspects of the pixel circuit are as follows, isolated or in a technically feasible combination:

- a light exposure measurement cycle of a photodiode by means of the exposure measurement circuit can also be initiated through an externally applied control signal independent from any detection in the photoreceptor signal derived from the intensity of the incident light at said photodiode;
- the light exposure of the photodiode is measured by determining the time for the voltage across a discharging capacitor of the exposure measurement circuit to reach at least one reference voltage;
- there is a first reference voltage and a second reference voltage, said first reference voltage being higher than said second reference voltage, and wherein the light exposure of the photodiode is measured by determining and comparing:
  - a first duration corresponding to the time for the voltage across a discharging capacitor of the exposure measurement circuit to reach said first reference voltage, and
  - a second duration corresponding to the time for the voltage across said discharging capacitor of the exposure measurement circuit to reach said second reference voltage;
- before the exposure measurement cycle, the capacitor of the exposure measurement circuit is charged by a voltage corresponding to the photoreceptor signal;
- the exposure measurement circuit comprises:
  - an input connected to the output of the front-end circuit for receiving the photoreceptor signal,
  - a capacitor connected by a first switch to said input, said first switch being configured for disconnecting said capacitor from said input,
  - a source current in series with a second switch, parallel to said capacitor, said second switch being configured for controlling a discharge of said capacitor, and the exposure measurement cycle comprises at least the following steps:

- opening a first switch for disconnecting the measurement capacitor from the input of the measurement exposure circuit,
- closing the second switch for allowing the discharge of the capacitor,
- determining the time for the discharging capacitor of the exposure to reach at least one reference voltage,
- determining the light exposure of the photodiode from the determined discharging time of the capacitor.

BRIEF DESCRIPTION OF THE DRAWINGS

Other aspects, objects and advantages of the present invention will become better apparent upon reading the following detailed description of preferred embodiments thereof, given as non-limiting examples, and made with reference to the appended drawings wherein.

In all figures, the same reference characters refer to the same elements.

DETAILED DESCRIPTION OF THE INVENTION

Figure 1:
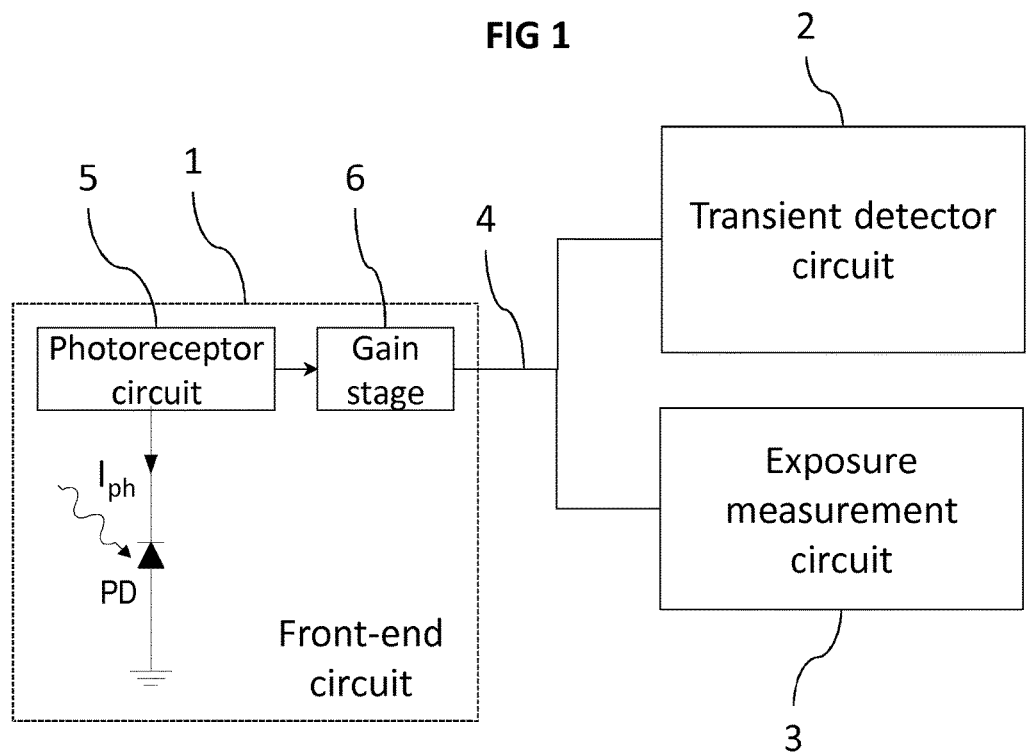
FIG. 1 shows a block diagram of a pixel circuit according to a possible embodiment of the invention.

A simplified diagram of a pixel circuit according to a possible embodiment is shown in FIG. 1. The pixel circuit comprises a front-end circuit 1, a transient detector circuit 2, and an exposure measurement circuit 3. The front-end circuit 1 comprises a single photodiode PD and has an output 4. The photodiode PD converts incident light into a photocurrent $I_{ph}$ determined by the light exposure of said single photodiode PD. The front-end circuit 1 also comprises a photoreceptor circuit 5 and a gain stage 6 for generating a photoreceptor signal derived from the light exposure of said single photodiode PD. The photoreceptor signal is delivered at the output 4 of the front-end circuit 1 in order to be exploited by both the transient detector circuit 2 and the exposure measurement circuit 3.

The transient detector circuit 2 is configured for detecting a change in the photoreceptor signal delivered on the front-end circuit output 4. The transient detector circuit 2 continuously monitors the photoreceptor signal for changes and responds with a signal that identifies a fractional increase or decrease in the photoreceptor signal that exceeds adjustable thresholds.

The exposure measurement circuit 3 is configured for measuring the photoreceptor signal delivered on the output 4 of the front-end circuit 1. The exposure measurement cycle is initiated if the transient detector 2 circuit has detected a change in the photoreceptor signal, but it can also be initiated through an externally applied control signal independent from any change detection.

Transient Detector Circuit

U.S. Pat. No. 7,728,269 discloses a transient detector circuit that can be used in some embodiments of the invention. Principles of such a transient detector circuit are explained below.

Figure 2:
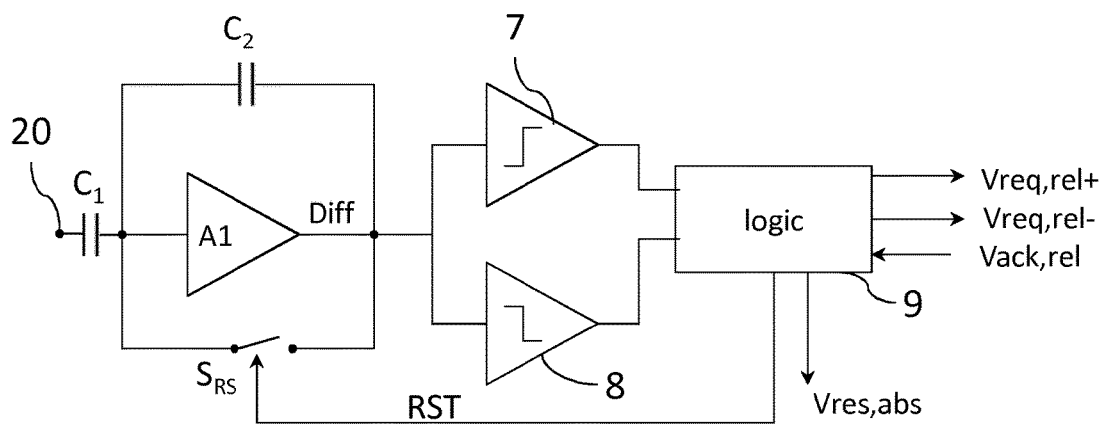
FIGS. 2 and 3 show simplified diagrams of exemplary embodiments of transient detector circuits for detecting changes in the photoreceptor signal.

A simplified diagram of the transient detector circuit 2 for detecting changes in the photoreceptor signal is shown on FIG. 2. The input signal $V_{front}$ at the input 20 of the transient detector circuit 2 is the photoreceptor signal $V_{front}$ at output 4 of the front-end circuit 1. The transient detector circuit 2 comprises a first capacitor $C_1$. One of the terminals of said first capacitor $C_1$ is connected to the input 20 of the transient detector circuit 2, i.e. it is connected to the output 4 of the font-end circuit 1. The other terminal of the first capacitor $C_1$ is connected to an amplifier A1, a second capacitor $C_2$ and a reset switch $S_{RS}$, said amplifier A1, second capacitor $C_2$ and reset switch $S_{RS}$ being arranged in parallel, and connected on one end to the first capacitor $C_1$ and on the other end to a common node Diff. Capacitances and gain are chosen so as to define a self-timed, self-balancing switched-capacitor amplifier. Two voltage comparators 7, 8, respectively detect upward and downward changes of the voltage $V_{Diff}$ at the common node Diff. The voltage comparators 7, 8, have the common node Diff at their inputs, and their outputs are connected to a logic circuit 9.

Changes of the photoreceptor signal are amplified by the capacitively coupled inverting amplifier A1 and appear as a deviation from a defined voltage level (operating point after a reset event) at the node Diff. If the signal at the common node Diff crosses certain adjustable threshold levels, this event is detected by one of two voltage comparators 7, 8, which sends a signal to the logic circuit 9, and a request signal (Vreq,rel+ or Vreq,rel−, depending on the direction of the detected change) is activated by the logic circuit 9.

Upon receiving the request signal, Vreq,rel+ or Vreq,rel−, and retrieving associated pixel data (see below), an external data receiver (not shown) sends back an acknowledge signal Vack,rel that is turned into a reset signal RST by the logic block 9. The reset signal RST controls the reset switch $S_{RS}$, and such an activation closes the reset switch $S_{RS}$. Accordingly, the input node of the amplifier A1 is short-circuited to its output and the operating point of the amplifier A1 is reset. Subsequently the request signal is deactivated and the circuit is ready for detecting a new change event.

The request signal Vreq,rel+ or Vreq,rel− is also used to generate the control signal Vres,abs sent to the exposure measurement circuit 3 to initiate an absolute exposure measurement, making this measurement conditional to the prior detection of a change in pixel illuminance, signaled by the transient circuit detector 2. Alternatively, the entire (1 or 2-dimensional) pixel array can be initiated to execute an exposure measurement simultaneously in all pixels by an externally applied control signal.

The request signals Vreq,rel+ and Vreq,rel− are sent to a bus arbiter (not shown) which initiates and controls the transmission of data packets. In this way changes in photodiode illumination are detected and as a result, the array address of the respective pixel is transmitted with low latency over an asynchronous data bus (not shown), thereby signaling the coordinates in space and (inherently) in time of the detected change. The direction of change (increase or decrease) for each event is determined by which one of the two comparators detects the event.

Figure 3:
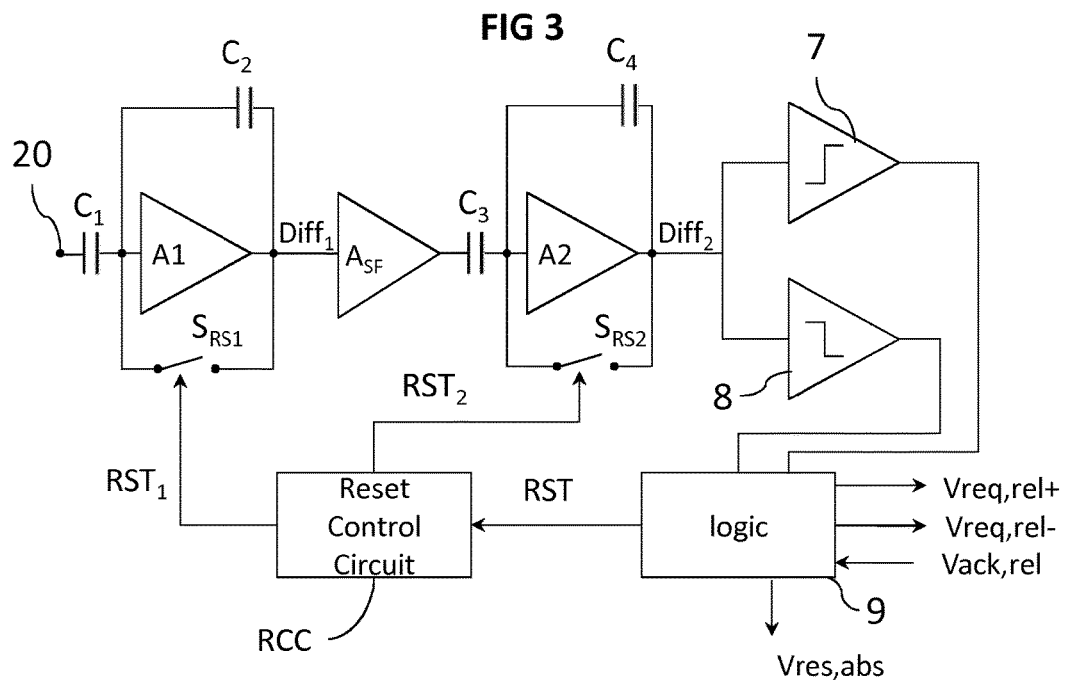

FIG. 3 illustrates an improvement of the transient detector circuit 2, wherein a two-stage amplifier is used instead of the single capacitively coupled inverting amplifier whereby greatest temporal contrast sensitivity can be achieved. Such a structure is disclosed in the article of C. Posch, D. Matolin and R. Wohlgenannt, "A Two-Stage Capacitive-Feedback Differencing Amplifier for Temporal Contrast IR Sensors", Analog Integrated Circuits and Signal Processing Journal, vol. 64, no. 1, pp. 45-54, 2010.

The two-stage topology of single-ended inverting common-source stages with capacitive feedback, operating in the sub-threshold region and separated by a follower buffer $A_{SF}$, allows a significant increase in amplifier gain per unit area and leads to reduced charge injection noise (as explained below), consequently improving the temporal contrast sensitivity of the transient detector circuit.

The first stage has a first capacitor $C_1$ connected by one of its terminal to the input 20 of the transient detector circuit 2, the other terminal of the first capacitor $C_1$ is connected to a first amplifier A1, a second capacitor $C_2$ and a first reset switch $S_{RS1}$, said first amplifier A1, second capacitor $C_2$ and first reset switch $S_{RS}$ being arranged in parallel, and connected on one end to the first capacitor $C_1$ and on the other end to a first node $Diff_1$. The second capacitor $C_2$ is thus being charged by means of the photoreceptor signal at the output 4 of the front-end circuit 1.

The follower buffer $A_{SF}$ separates the two stages. It is connected on one end to the first node $Diff_1$ of the first stage and on the other end to a terminal of a third capacitor $C_3$ that belongs to the second stage. The other terminal of the third capacitor $C_3$ is connected to a second amplifier A2, a fourth capacitor $C_4$ and a second reset switch $S_{RS2}$, said second amplifier A2, fourth capacitor $C_4$ and second reset switch $S_{RS2}$ being arranged in parallel, and connected on one end to the third capacitor $C_3$ and on the other end to a second node $Diff_2$. The two voltage comparators 7, 8, are connected to the second stage through the second node $Diff_2$. The two voltage comparators 7, 8 are threshold detectors arranged to detect if a voltage over the fourth capacitor $C_4$ exceeds threshold values, and if it does, a signal is sent to the control logic 9, and a request signal (Vreq,rel+ or Vreq,rel−, depending on the direction of the detected change) is activated by the logic circuit 9 as described above).

With both amplifier stages having similar gain, the charge injection in the first stage through the first reset switch $S_{RS1}$ has a greater impact on the amplified signal at second node $Diff_2$ than a charge injection in the second stage through the second reset switch $S_{RS2}$. To eliminate the effect of the charge injection of the first reset switch $S_{RS1}$, it is sufficient to guarantee that the second stage is turned on sufficiently after the first stage. This is achieved by appropriately delaying the switching of the second reset switch $S_{RS2}$ with respect to the first reset switch $S_{RS1}$.

A reset control circuit RCC is thus provided, which receives the reset signal RST from the logic circuit 9 and outputs a first reset signal $RST_1$ controlling the first reset switch $S_{RS1}$ and a second reset signal $RST_2$ controlling the second reset switch $S_{RS2}$. The first and second reset signals can thus be controlled in order to eliminate the charge injection due to the first reset switch $S_{RS1}$.

Exposure Measurement

A light exposure measurement cycle of a photodiode by means of the exposure measurement circuit 3 is usually initiated by detection, by the transient detector circuit 2, of a change in the photoreceptor signal derived from the intensity of the incident light at the photodiode PD. The light exposure of the photodiode PD is measured by determining the time for a voltage across a discharging capacitor $C_s$ of the exposure measurement circuit 3 to reach at least a reference voltage. Before the exposure measurement cycle, the measurement capacitor Cs of the exposure measurement circuit 3 is charged by a voltage corresponding to the photoreceptor signal.

Exposure Measurement Circuit—1$^{st}$ Embodiment

Figure 4:
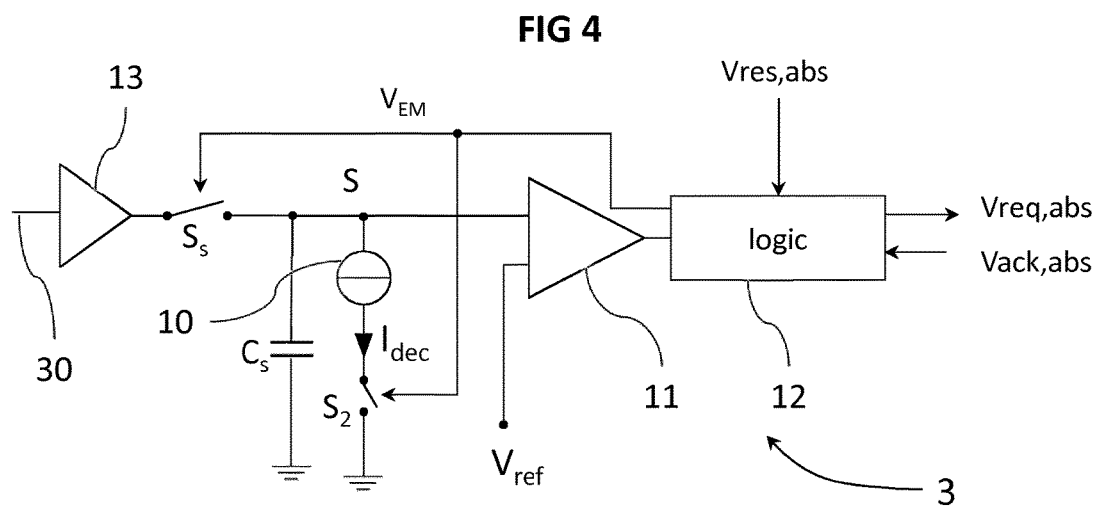
FIGS. 4 and 5 show simplified diagrams of exemplary embodiments of the exposure measurement circuit for measuring the photoreceptor signal.

FIG. 4 shows a simplified diagram of an example of the exposure measurement circuit 3 for measuring the photoreceptor signal according to a possible embodiment of the invention. The exposure measurement circuit 3 comprises an input 30 connected to the output 4 of the front-end circuit 1 for receiving the photoreceptor signal. A measurement capacitor $C_S$ is connected by a first switch $S_S$ to the input 30. A unity-gain buffer 13 may be provided at the input 30. The first switch $S_S$ is configured for connecting or disconnecting the measurement capacitor Cs from the input 30, and is controlled to this end by a measurement control signal $V_{EM}$.

The measurement control signal $V_{EM}$ is derived by logic block 12 from the control signal $V_{res,abs}$ sent by the control logic 9 of the transient detector circuit 2 upon detection of a change in the photoreceptor signal.

The measurement capacitor $C_s$ and the first switch $S_S$ are connected through a common node S. The other terminal of the measurement capacitor Cs is grounded. In parallel to the measurement capacitor $C_s$, a current source 10 is arranged in series with a second switch $S_2$. The second switch $S_2$ is also controlled by the measurement control signal $V_{EM}$ and is configured for controlling a discharge of the measurement capacitor $C_s$. When the second switch $S_2$ is not passing (open state), the branch of the current source 10 is open, and thus the measurement capacitor $C_S$ cannot discharge. When the second switch $S_2$ is passing (closed state), the branch of the current source 10 is closed, and thus the measurement capacitor $C_S$ can discharge through this branch. The second switch $S_2$ is connected to ground, or it may be connected to any current sink. The first and second switches may be implemented as MOS transistors. It shall be noted that for illustration purposes, the first switch $S_S$ and the second switch $S_2$ are both depicted in an open state at the same time, but in operation only one of them is open while the other is closed. The same applies for the switches of FIG. 5.

The exposure measurement circuit 3 comprises a voltage comparator 11, having a signal input connected to one of the terminals of the measurement capacitor Cs and a reference input connected a reference voltage $V_{ref}$. The terminal of the measurement capacitor Cs connected to the measurement comparator 11 is the common node S to which are connected the first switch $S_S$ and the current source 10. The output of the voltage comparator 11 is fed to a logic circuit 12. The logic circuit 12 is responsible for controlling the status of the exposure measurement cycle and for the (asynchronous) transmission of the pixel signals, and hence of the result of the exposure measurement, to an address encoder and bus arbiter (not shown).

For exposure measurement, the instantaneous voltage $V_S$ at the common node S, to which the measurement capacitor Cs and the current source 10 are connected, is used. The instantaneous voltage $V_s$ can be approximated as $$V_s = k_1 \ln(I_{ph}) + k_2$$

wherein $I_{ph}$ is the intensity of the photocurrent of the photodiode PD of the front-end circuit 1, $k_1$ and $k_2$ are constant factors. The instantaneous value of the voltage $V_S$ relates logarithmically to the instantaneous photocurrent $I_{ph}$; consequently a measurement of the voltage $V_S$ allows to reconstruct instantaneous photocurrent $I_{ph}$, and thus to derive the light exposure level of the photodiode PD.

Constants $k_1$ and $k_2$ depend on details of the circuit implementation as well as on individual device parameters which can vary due to non-uniform fabrication process parameters. Consequently, $k_1$ and $k_2$ may not be identical for individual pixel circuits across an array (leading to so-called fixed pattern noise, FPN). Preferably, $k_1$ and $k_2$ are determined for each pixel individually, and their influence on the exposure measurement results are removed by calibration. Such a calibration can for example be based on a homogeneous optical stimulation of the pixel array, or on uniform electrical signal stimulation.

Before the initiation of an exposure measurement cycle, the first switch $S_s$ is closed, so that the common node S is connected to the input 30 of the exposure measurement circuit 3. The voltage $V_s$ at the common node S thus follows the voltage $V_{front}$ at the output 4 of the front-end circuit 1. The voltage between the terminals of the measurement capacitor $C_s$ also follows the voltage $V_{front}$ at the output 4 of the front-end circuit 1, and consequently depends on the light exposure of the photodiode PD.

After the transient detector circuit 2 has detected a relative change in illumination, a measurement control signal $V_{res,abs}$ is received by the exposure measurement circuit 3, which initiates an exposure measurement cycle.

Upon activation of the control signal $V_{res,abs}$, the first switch $S_s$ is opened by the measurement control signal $V_{EM}$, thus disconnecting the measurement capacitor Cs from the input 30 of the exposure measurement circuit 3. At that moment, the measurement capacitor $C_S$ is charged according to the instantaneous value of the common node voltage $V_S$ before opening the first switch $S_S$. The second switch $S_2$ can be simultaneously closed by means of the same measurement control signal $V_{EM}$, or shortly after by means of another signal that controls the second switch $S_2$.

A reference voltage $V_{ref}$ is applied to a reference input of the voltage comparator 11 with reference voltage $V_{ref}$ being chosen so that in every case the relation $V_{ref} < V_S$ is assured. The signal input of the voltage comparator 11 is connected to $V_S$. Due to the closing of the second switch $S_2$, the measurement capacitor Cs is discharged by a constant current $I_{dec}$ controlled by the current source 10. The voltage $V_S$ at the signal input of the measurement comparator 11 thus decreases, with a decreasing rate that depends on the capacitance of the measurement capacitor Cs and on the intensity of the constant current $I_{dec}$ imposed by the current source 10.

When the voltage $V_S$ at the signal input of the measurement comparator 11 reaches the reference voltage $V_{ref}$, the measurement comparator 11 switches, i.e. it toggles its output, and an end-of-measurement signal $V_{req,abs}$ is activated by logic block 12. The time between the active edges of the control signal $V_{res,abs}$ and the end-of-measurement signal $V_{req,abs}$ encodes the average absolute pixel exposure measure during this time, according to the relation $$V_S(I_{ph}) - V_{ref} = \frac{I_{dec}}{C_s} T$$

where $I_{dec}$ denotes the intensity of the constant current imposed by the current source 10, $C_s$ is the capacitance of the measurement capacitor Cs, $I_{ph}$ is the intensity of the photocurrent of the photodiode PD, and T is the time needed for the voltage $V_s$ to reach the reference voltage $V_{ref}$ (or in other words the time between the active edges of the control signal $V_{res,abs}$ and the end-of-measurement signal $V_{req,abs}$). From this relation, and due to the fact that $$V_s k_1 \ln(I_{ph}) + k_2,$$

the intensity $I_{ph}$ of the photocurrent of the photodiode PD and hence the pixel light exposure can be determined.

Similar to the request signals (Vreq,rel+ and Vreq,rel−) derived from the change detection events, the exposure measurement request signals Vreq,abs are sent to a bus arbiter (not shown) which initiates and controls the transmission of data packets. In this way, the array address of the respective pixel is transmitted with low latency over an (asynchronous) data bus (not shown), thereby signaling the coordinates in space and—inherently—in time of the end-of-measurement, thus effectively transmitting the instantaneous pixel grey level value.

Alternatively, control logic 12 can contain a digital counter device that directly digitizes the time between activation of control signal $V_{res,abs}$ and the exposure measurement request signals Vreq,abs. In this case, said transmitted data packet can contain, in addition to the pixel array address, the measured grey level digitized by the counter.

With the deactivation by control logic 12 of control measurement control signal $V_{EM}$, the first switch $S_S$ is closed, and the second switch $S_2$ is opened, so that voltage $V_s$ at the common node S can resume tracking the photocurrent signal. The deactivation of signal $V_{EM}$ is done by control logic 12 upon reception of an external acknowledge signal $V_{ack,abs}$. A new exposure measurement cycle can be started as soon as initiated by the transient detector circuit 2 or by an external signal.

It shall be noted that charge injection into capacitor $C_s$ occurs while opening the first switch $S_s$, which influences the signal voltage $V_s$. In order to minimize this charge injection, the measurement capacitor should have a high enough capacitance $C_s$, and techniques for compensation such as dummy switches and balanced transistor switches or bottom-plate transistor switches can be used.

Exposure Measurement Circuit—$2^{nd}$ Embodiment

Figure 5:
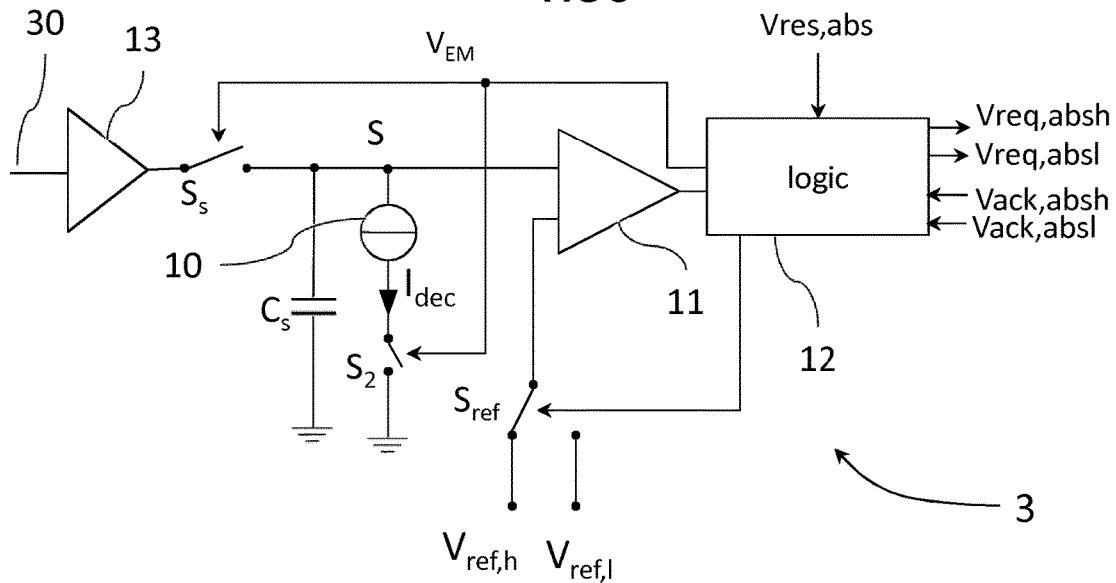

FIG. 5 shows a simplified diagram of an example of the exposure measurement circuit 3 for measuring the photoreceptor signal according to another possible embodiment of the invention. This embodiment is similar to the embodiment depicted in FIG. 4 and described above, except in that the reference input of the measurement comparator 11 is connected to the reference switch $S_{ref}$ instead of being directly connected to a reference voltage $V_{ref}$. The reference switch $S_{ref}$ is operable to connect the reference input of the measurement comparator 11 either to a first reference voltage $V_{ref,h}$ or a second reference voltage $V_{ref,l}$. The first reference voltage $V_{ref,h}$ is higher than the second reference voltage $V_{ref,l}$. The reference switch $S_{ref}$ is controlled by the logic block 12.

As in the embodiment depicted in FIG. 3, activation of the of the measurement control signal $V_{EM}$ by logic block 12 upon reception of control signal $V_{res,abs}$ opens the first switch $S_s$, thus disconnecting the measurement capacitor Cs from the exposure measurement input 30. Activation of the control signal $V_{res,abs}$ also resets the logic block 12 to an initial state $Z_0$, and, via the logic block 12, controls the reference switch $S_{ref}$ so that the first reference voltage $V_{ref,h}$ is selected to be applied to the reference input of the voltage comparator 11.

As previously described, the second switch $S_2$ is closed and the voltage $V_s$ at the signal input of the measurement comparator 11 decreases, with a decrease rate that depends on the capacitance of the measurement capacitor Cs and on the intensity of the constant current $I_{dec}$ imposed by the current source 10. When the voltage $V_s$ reaches the first reference voltage $V_{ref,h}$, the measurement comparator 11 switches, i.e. it toggles its output, and the first end-of measurement signal $V_{req,absh}$ is activated. The logic block 12 changes to another state $Z_1$, and the reference switch $S_{ref}$ is switched so that the second reference voltage $V_{ref,l}$ is selected to be applied to the reference input of the voltage comparator 11. The discharge of the measurement capacitor Cs continues, and after time $T_{ref}$, the voltage $V_s$ reaches the level of the second reference voltage $V_{ref,l}$, whereby the second end-of measurement signal $V_{req,absl}$ is activated. With the activation of the second end-of measurement signal $V_{req,absl}$, logic circuit 12 is changed to an idle state $Z_2$, the first switch $S_S$ is closed, and the second switch $S_2$ is opened, so that voltage $V_s$ can resume tracking the photocurrent signal. A new exposure measurement cycle can then be started as soon as initiated by the transient detector circuit 2 or by an external signal.

The light exposure of the photodiode PD is measured by determining and comparing durations corresponding to the time for the voltage across the discharging capacitor $C_S$ to reach the first and second reference voltages. During a measurement cycle, a relation between the different values is:

$$\frac{I_{dec}}{C_s} = \frac{V_{ref,h} - V_{ref,l}}{T_{ref}}$$

The first reference voltage $V_{ref,h}$ and the second reference voltage $V_{ref,l}$ are external voltages provided to each pixel of the array. Accordingly, the voltage difference $V_{ref,h} - V_{ref,l}$ is the same for every pixel of an array. As previously, with T the duration for the decreasing voltage $V_s$ to reach the first reference voltage $V_{ref,h}$, the following relation still holds:

$$V_S(I_{ph}) - V_{ref,h} = \frac{I_{dec}}{C_s} T$$

Accordingly, $$V_S(I_{ph}) - V_{ref,h} = \frac{V_{ref,h} - V_{ref,l}}{T_{ref}} T$$

It shall be noted that the exact values of the current $I_{dec}$ imposed by the current source 10 and the capacitance $C_s$ of the measurement capacitor are canceled out, and do not influence the determination of the intensity of the photocurrent $I_{ph}$ that can be deduced. Since the intensity $I_{dec}$ and the capacitance $C_s$ may differ from a pixel to another, and are prone to be affected by fabrication process parameter variation, a determination of intensity of the photocurrent $I_{ph}$ independent from such values is more reliable.

Similar to the first embodiment of the exposure measurement circuit, both signals Vreq,absh and Vreq,absl are sent to a bus arbiter (not shown) which initiates and controls the transmission of data packets. In this way, the array address of the respective pixel is transmitted with low latency over an (asynchronous) data bus (not shown), thereby signaling the coordinates in space and (inherently) in time of the first and second threshold voltage crossings (signifying beginning and end of an exposure measurement, respectively), thus effectively transmitting the instantaneous pixel grey level value.

Again similar to the first embodiment of the exposure measurement circuit, control logic 12 can contain a digital counter device that directly digitizes the time between (activation of) signals Vreq,absh and Vreq,absl. In this case, only Vreq,absl is sent to the bus arbiter (not shown) which initiates and controls the transmission of data packets, along with the result of said digitization. Hence, the transmitted data packet can contain, in addition to the pixel array address, the measured grey level digitized by the counter.

Alternative Exposure Measurement Circuit

Figure 10:
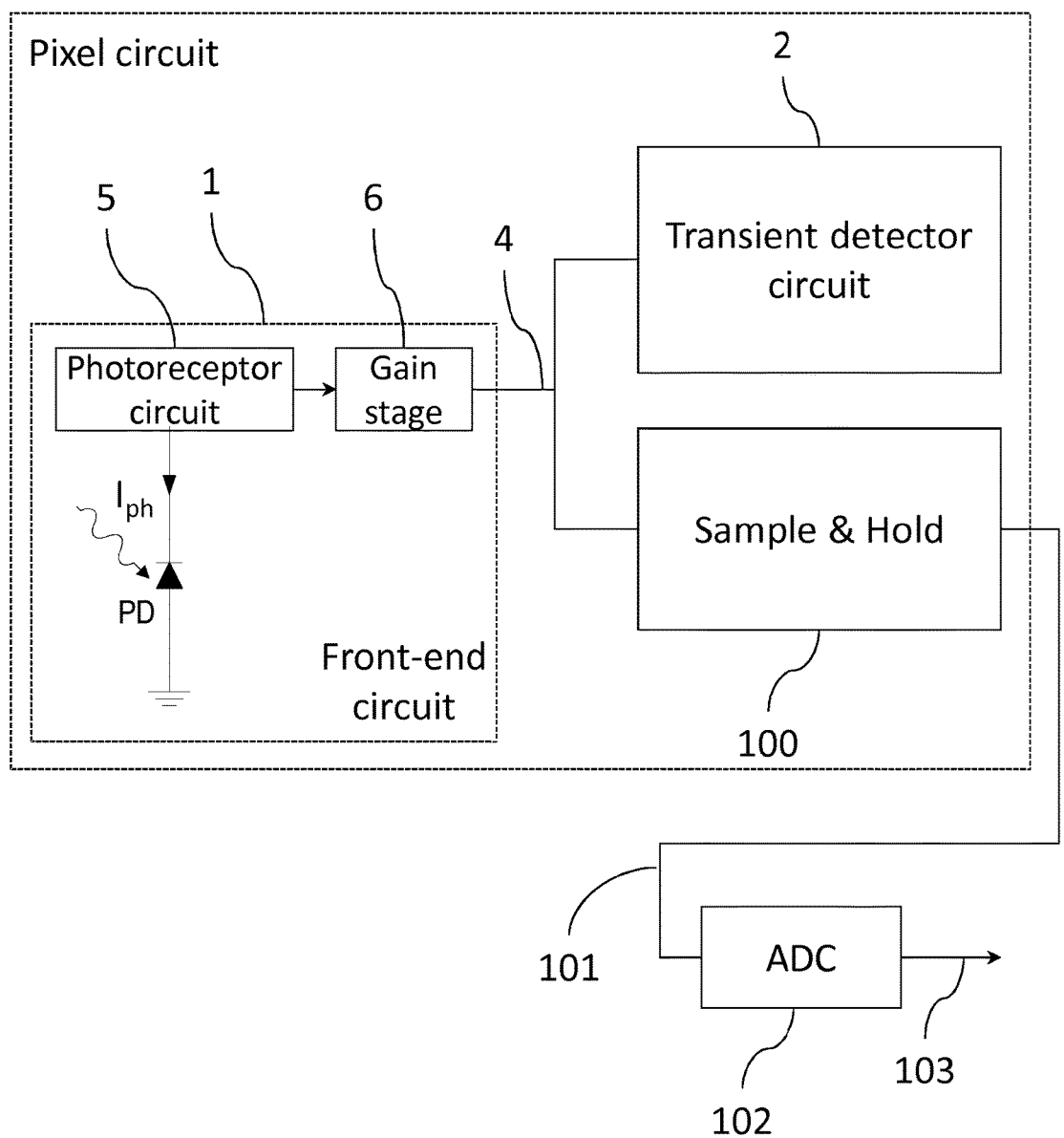
FIG. 10 shows an alternative block diagram of a pixel circuit according to a possible embodiment of the invention, connected to a pixel-external analog-to-digital converter.

In an alternative embodiment illustrated by FIG. 10, the exposure measurement circuit 3 is constituted by a sample-and-hold circuit 100 that samples the output 4 of the front-end circuit 1 at the time of activation by the transient detector circuit 2 of control signal $V_{res,abs}$. The output 101 of the sample-and-hold circuit 100 is connected to a pixel-external voltage analog-to-digital converter (ADC) 102. One ADC 102 per pixel array or one ADC 102 per pixel column can be arranged. The output 103 of the ADC 102 is connected to a data bus (not shown).

Similar to the previous embodiments, activation of the sample-and-hold circuit 100 is controlled by control signal $V_{res,abs}$ from transient detector circuit 2. After completed sample operation of the instantaneous voltage level at the output 4 of the front-end circuit upon reception of active control signal $V_{res,abs}$, the sampled voltage is sent to the ADC via output 101 for analog-to-digital conversion. After completed analog-to-digital conversion, the result of the conversion along with the pixel array address is transmitted to a bus arbiter (not shown) which initiates and controls the transmission of data packets. In this way, the array address of the respective pixel and its instantaneous grey level are transmitted with low latency over an (asynchronous) data bus (not shown).

Photoreceptor Circuit—Prior Art Embodiment

Figure 6:
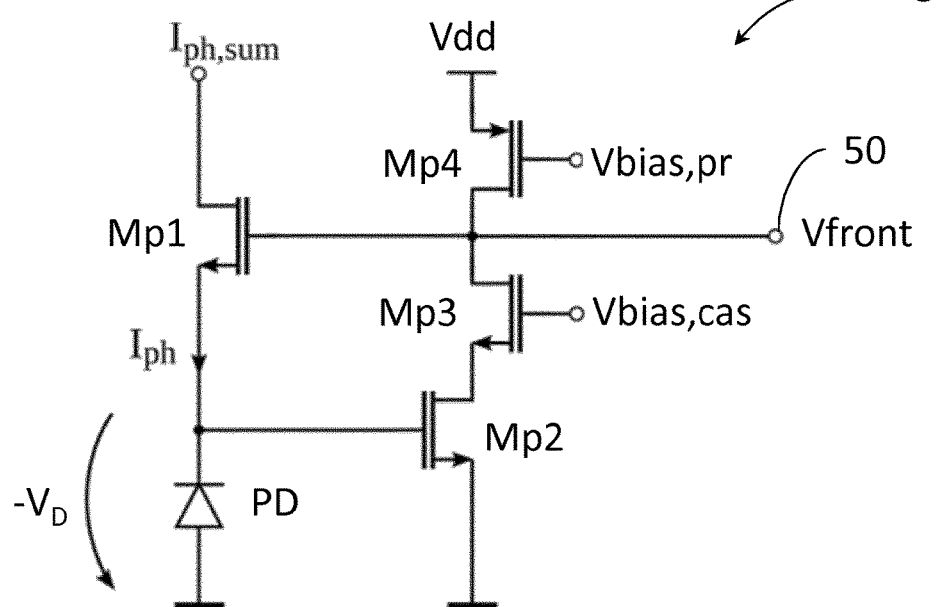
FIGS. 6 and 7 show simplified diagrams of exemplary embodiments of photoreceptor circuits.

The photoreceptor circuit 5 of the front-end circuit 1 can for example be the one described in U.S. Pat. No. 7,728,269, which is depicted in FIG. 6. This circuit comprises an output 50 for delivering the photoreceptor signal derived from the light exposure of the single photodiode PD, said photoreceptor signal being constituted by a front voltage Vfront. It also comprises a first photoreceptor transistor Mp1 having a drain and a gate, the gate of said first photoreceptor Mp1 being connected to said output 50. A second photoreceptor transistor Mp2 has its gate connected to the photodiode PD and its source is grounded (i.e. connected to a low supply voltage) while its drain is connected to the source of a third photoreceptor transistor Mp3, whose gate is biased by a biasing voltage Vbias,cas. The drain of the third photoreceptor transistor Mp3 is connected to the output 50, thus also to the gate of the first photoreceptor transistor Mp1. The drain of the third photoreceptor transistor Mp3 is also connected to the drain of a fourth photoreceptor transistor Mp4, whose gate is biased by a biasing voltage Vbias,pr and whose source is connected to a high supply voltage Vdd. The first photoreceptor transistor Mp1, the second photoreceptor transistor Mp2 and the third photoreceptor transistor Mp3 are N-type MOSFETs, while the fourth photoreceptor transistor Mp4 is a P-type MOSFET.

The output voltage Vfront shows a logarithmic relation to the photocurrent $I_{ph}$:

$$V_{front} = n_{Mp1} \cdot V_t \cdot \ln\left(\frac{L_{Mp1}}{W_{Mp1}} \frac{I_{ph}}{I_{0,Mp1}}\right) - V_D$$

where $n_{Mp1}$ is the sub-threshold slope factor of the first photoreceptor transistor Mp1, $V_t$ is the thermal voltage, $L_{Mp1}$ is the channel length of the first photoreceptor transistor Mp1, $W_{Mp1}$ is the channel width of the first photoreceptor transistor Mp1, $I_{0,Mp1}$ is the sub-threshold saturation current of the first photoreceptor transistor Mp1, and $V_D$ is the reverse voltage across the photodiode PD.

A change in the photocurrent $I_{ph}$ from a first value $I_{ph1}$ to a second value $I_{ph2}$ causes a change $\Delta V_{front}$ of the output voltage $V_{front}$ according to:

$$\Delta V_{front} = n_{Mp1} \cdot V_t \cdot \ln\left(\frac{I_{ph2}}{I_{ph1}}\right)$$

Due to the feedback of the output 50 to the input of the amplifier constituted by transistors Mp2, Mp3 and Mp4, the bandwidth of the photoreceptor element is significantly increased compared to non-feedback logarithmic photoreceptor circuits. The 3-dB frequency, which corresponds to the half power point, is approximately calculated as $$f_{3dB} = \frac{1}{2\pi} \frac{1}{\frac{C_D}{v} + C_{Mp1,a}} \cdot \frac{I_{ph}}{V_t} \cong \frac{1}{2\pi} \frac{1}{C_{Mp1,a}} \cdot \frac{I_{ph}}{V_t}$$

with $C_{Mp1,a}$ is the capacitance between the source of the first photoreceptor transistor Mp1 and the output of the amplifier constituted by the second, third and fourth photoreceptor transistors Mp2, Mp3 and Mp4, which is also the output 50 of the photoreceptor circuit 5, $C_D$ is the junction capacitance of the photodiode PD, $V_t$ is the thermal voltage, and $v$ is the small signal gain of the amplifier constituted by the second, third and fourth photoreceptor transistors Mp2, Mp3 and Mp4.

It shall be noted that the capacitance $C_{Mp1,a}$ depends mainly on the gate-source overlap capacitance of the first photoreceptor transistor Mp1, which is proportional to its channel width. For usual large values of the small signal gain v, the 3 dB frequency of the circuit, in comparison to a configuration without feedback, is no longer dominated by the capacitance of the photodiode PD, but by the much smaller gate-source overlap capacitance of the first photoreceptor transistor Mp1.

Improved Photoreceptor Circuit

Figure 7:
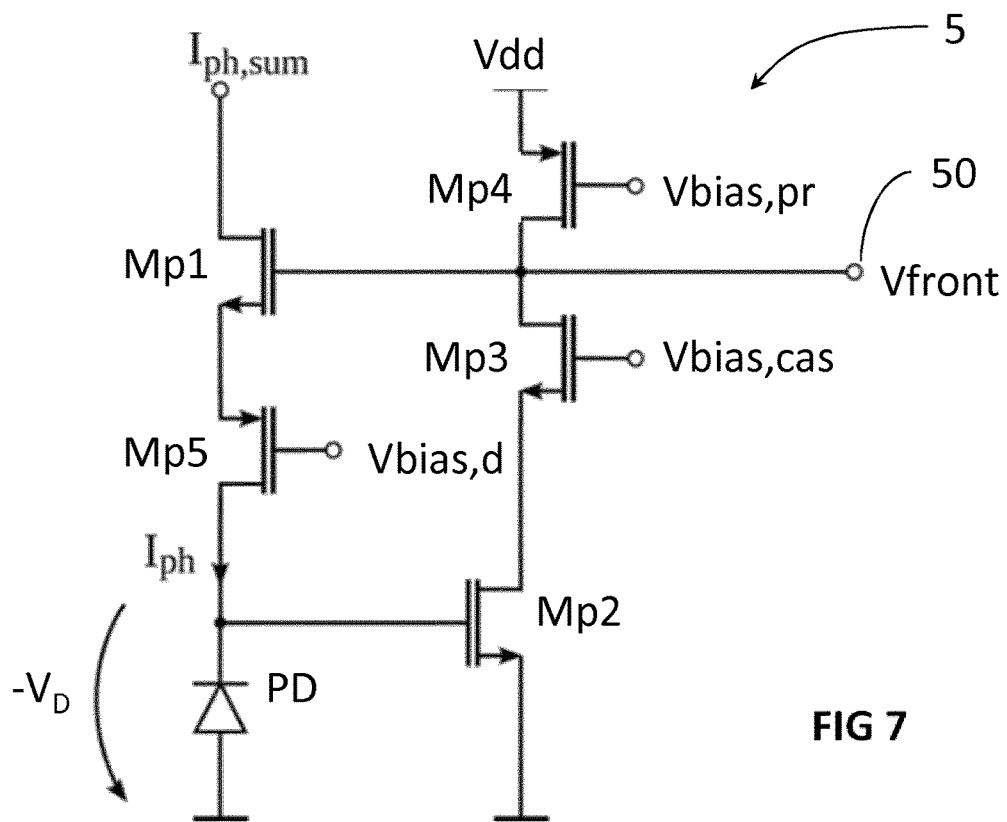

FIG. 7 shows another circuit exhibiting significant improvements with respect to the gain and the bandwidth. The improved circuit is also a logarithmic, continuous-time photoreceptor circuit with feedback for improving the bandwidth, but compared to the photoreceptor circuit of FIG. 6, an additional fifth photoreceptor transistor Mp5 is arranged between the photodiode PD and the first photoreceptor transistor Mp1.

Accordingly, the improved photoreceptor circuit 5 of FIG. 7, comprises an output 50 for delivering the photoreceptor signal derived from the light exposure of said single photodiode, said photoreceptor signal being constituted by a voltage Vfront. It comprises a first photoreceptor transistor Mp1 having a drain and a gate, the gate of said first photoreceptor Mp1 being connected to said output 50. It also comprises a fifth photoreceptor transistor Mp5 having a drain, a source and a gate, the source of said fifth photoreceptor transistor Mp5 being connected to the single photodiode PD and the gate of fifth photoreceptor transistor Mp5 being biased by a biasing voltage Vbias,d. The first photoreceptor transistor Mp1 and the fifth photoreceptor transistor Mp5 have a common source.

The other photoreceptor transistors are arranged in a way similar to the circuit of FIG. 6, constituting an amplifier. A second photoreceptor transistor Mp2 has its gate connected to the photodiode PD and to the drain of the fifth photoreceptor transistor Mp5. Its source is grounded (i.e. connected to a low supply voltage) while its drain is connected to the source of a third photoreceptor transistor Mp3, whose gate is biased by a biasing voltage Vbias,cas. The drain of the third photoreceptor transistor Mp3 is connected to the output 50, thus also to the gate of the first photoreceptor transistor Mp1. The drain of the third photoreceptor transistor Mp3 is also connected to the drain of a fourth photoreceptor transistor Mp4, whose gate is biased by a biasing voltage Vbias,pr and whose source is connected to a high supply voltage Vdd. The first photoreceptor transistor Mp1, the second photoreceptor transistor Mp2 and the third photoreceptor transistor Mp3 are N-type MOSFET, while the fifth photoreceptor transistor Mp5 and the fourth photoreceptor transistor Mp4 are P-type MOSFET.

Regarding the gain increase, the output voltage $V_{front}$ of the circuit of FIG. 6 still depends logarithmically on the photocurrent intensity $I_{ph}$:

$$V_{front} = n_{Mp1} \cdot V_t \cdot \ln\left(\frac{L_{Mp1}}{W_{Mp1}} \frac{I_{ph}}{I_{0,Mp1}}\right) + n_{Mp5} \cdot V_t \cdot \ln\left(\frac{L_{Mp5}}{W_{Mp5}} \frac{I_{ph}}{I_{0,Mp5}}\right) + V_{bias,d}$$

with $n_{Mp5}$ being the sub-threshold slope factor of the fifth photoreceptor transistor Mp5, $L_{Mp5}$ is the channel length of the first photoreceptor transistor Mp5, $W_{Mp5}$ is the channel width of the first photoreceptor transistor Mp5, $I_{0,Mp5}$ is the sub-threshold saturation current of the first photoreceptor transistor Mp5, and $V_{bias,d}$ the biasing voltage applied to the gate of the fifth photoreceptor transistor Mp5.

A change in the photocurrent $I_{ph}$ from a first value $I_{ph1}$ to a second value $I_{ph2}$ causes a change $\Delta V_{front}$ of the output voltage $V_{front}$ according to:

$$\Delta V_{front} = n_{Mp1} \cdot V_t \cdot \ln\left(\frac{I_{ph2}}{I_{ph1}}\right) + n_{Mp5} \cdot V_t \cdot \ln\left(\frac{I_{ph2}}{I_{ph1}}\right)$$

Assuming that $n_{Mp1} \approx n_{Mp5}$, it can be simplified to:

$$\Delta V_{front} \approx 2 \cdot n_{Mp1} \cdot V_t \cdot \ln\left(\frac{I_{ph2}}{I_{ph1}}\right)$$

Accordingly, the gain is doubled with respect to the photoreceptor circuit of FIG. 6.

The increased gain achieved by the photoreceptor circuit of FIG. 7 allows for smaller current intensity changes $\Delta I_{ph}$ of the photocurrent $I_{ph}$ to be detected since in response to a certain change $\Delta I_{ph}$ in the intensity of the photocurrent $I_{ph}$, the resulting voltage change is increased by a doubled gain. Further, since the resulting voltage change is increased before the input of a following amplifier, such as the switched-capacitor differencing amplifier of the transient detector circuit 3, the gain of such a following amplifier can be smaller while achieving the same overall temporal contrast (i.e. relative change) sensitivity, leading to a significant reduction of the CMOS device size, especially the capacitor size of a switched-capacitor amplifier.

Regarding the bandwidth, the 3-dB frequency, which corresponds to the half power point, is approximately calculated as $$f_{3dB} \approx \frac{1}{2\pi} \frac{1}{C_{Mp5,DS}} \cdot \frac{I_{ph}}{V_t}$$

where $C_{Mp5,DS}$ is the drain-source coupling capacitance of the fifth transistor Mp5. In general, this capacitance is significantly smaller than the gate-source overlap capacitance $C_{Mp1}$ of the first photoreceptor transistor Mp1 that used to determine the 3-dB frequency in the circuit of FIG. 6. The bandwidth is therefore increased by the ratio $C_{Mp5,DS}/C_{Mp1}$.

Due to the increased bandwidth of the photoreceptor circuit 5, the response delay of the transient detector circuit 2 is significantly reduced, and the temporal resolution of the pixel circuit and thus of the sensor device is improved.

Alternatively, the gate of the fifth photoreceptor transistor Mp5 can be connected to its source instead of being driven by a biasing voltage Vbias,d. In this configuration however, while the voltage gain is still doubled, there is no increase of the bandwidth.

Gain Stage

Figure 8:
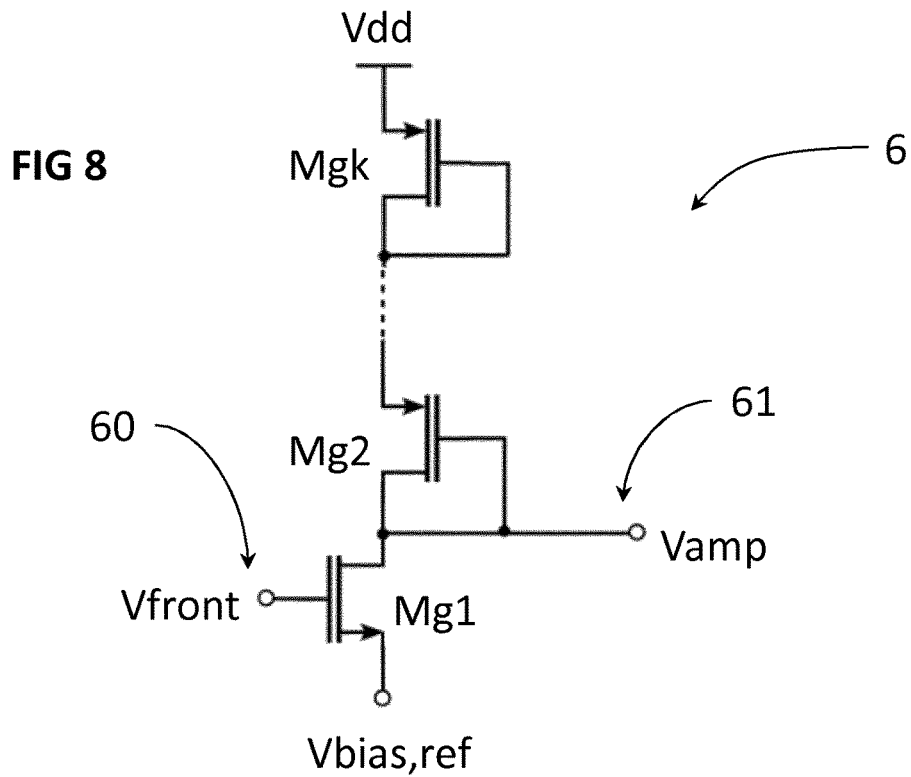
FIG. 8 shows a simplified diagram of a gain stage for amplifying changes in the photoreceptor signal prior to its exploitation by the transient detector circuit and by the exposure measurement circuit.

FIG. 8 shows a simplified diagram of an example of a pre-amplifier gain stage 6 for amplifying the signal Vfront at the output of the photoreceptor circuit 5, instead of a conventional follower buffer.

The pre-amplifier gain stage 6 comprises an input connected to the output of the photoreceptor circuit 5 for receiving the photoreceptor signal Vfront, and an output connected both to the input of the transient detector circuit 2 and to the input of the exposure measurement circuit 3, for delivering the amplified photoreceptor signal Vamp. The pre-amplifier gain stage 6 comprises a first gain transistor Mg1 having a drain, a source and a gate. The gate of the first gain transistor Mg1 is connected to the input of the gain stage, i.e. to the output of the photoreceptor circuit 5. The source of the first gain transistor Mg1 is connected to a reference biasing voltage Vbias,ref and the drain of said first gain transistor Mg1 is connected to the output of the gain stage. The first gain transistor Mg1 is an N-channel type MOS transistor.

The pre-amplifier gain stage 6 also comprises a plurality of gain transistors Mg2, Mgk in series, each one of these gain transistor Mg2, Mgk having a drain, a source and a gate, and each one of these gain transistors Mg2, Mgk in series having its drain connected to its gate (diode-connected transistors). One of these gain transistors in series has its drain connected to the drain of the first gain transistor Mg1 and is referred to as Mg2. Accordingly, this gain transistor Mg2 has its gate connected to the output of the gain stage 6. The gain transistors in series are P-channel type MOS transistors.

The described gain stage 6 is a common-source amplifier, the first gain transistor Mg1 being an N-MOS input transistor and the series of diode-connected P-MOS gain transistors Mg2, Mgk being a load. Such a structure with diode-connected load has a gain which is not strongly dependent on dimensions, so that dimension-related mismatch influence is reduced, which improve fixed-pattern noise (FPN) performance of the pixel array.

There are at least two diode-connected gain transistors in series Mg2, Mgk, i.e. k=3. Preferably, more diode-connected gain transistors are arranged in series. In preferred embodiments, three or four diode-connected gain transistors are connected in series. The maximum number of such diode-connected gain transistors are arranged in series is determined by the input voltage swing, i.e. the expected upper level of the input voltage Vfront such that the gate-source voltage across the series of diode-connected transistors Mg2 to Mgk is not limited by the resulting output voltage Vamp.

If the gain stage circuit 6 is operated in the sub-threshold region, and assuming equal dimensions for the diode-connected gain transistors in series Mg2 to Mgk, the output voltage $V_{amp}$ is calculated as follows:

$$V_{amp} = V_{DD} - (k-1) \cdot n_{Mg2} \cdot V_t \cdot \ln\left(\frac{L_{Mg2}}{W_{Mg2}} \frac{W_{Mg1}}{L_{Mg1}} \frac{I_{0,Mg1}}{I_{0,Mg2}}\right) - (k-1) \cdot \frac{n_{Mg2}}{n_{Mg1}} (V_{front} - V_{bias,ref})$$

Where
$V_{DD}$ is the high supply voltage,
$n_{Mg1}$ and $n_{Mg2}$ are the sub-threshold slope factors of the gain transistors Mg1 and Mg2, respectively,
$V_t$ is the thermal voltage,
$L_{Mg1}$ and $L_{Mg2}$ are the channel lengths of the first gain transistor Mg1 and of the second gain transistors Mg2, respectively,
$W_{Mg1}$ and $W_{Mg2}$ are the channel widths of the first gain transistor Mg1 and of the second gain transistors Mg2, respectively,
$I_{0,Mg1}$ and $I_{0,Mg2}$ are the sub-threshold saturation currents of the first gain transistor Mg1 and of the second gain transistors Mg2, respectively.

An input voltage change $\Delta V_{front}$ results in an output voltage change $\Delta V_{amp}$ of:

$$\Delta V_{amp} = -(k-1) \frac{n_{Mg2}}{n_{Mg1}} \Delta V_{front}$$

The gain thus provided by the gain stage 6 allows for smaller current intensity changes $\Delta I_{ph}$ of the photocurrent $I_{ph}$ to be detected since in response to a certain change $\Delta I_{ph}$ in the intensity of the photocurrent $I_{ph}$, the resulting voltage change is increased by a (k−1)-fold gain. Further, since the resulting voltage change is increased before the input of a following amplifier, such as the switched-capacitor differencing amplifier of the transient detector circuit 3, the gain of such a following amplifier can be smaller while achieving the same overall contrast sensitivity, leading to a significant reduction of the CMOS device size, especially the capacitor size of a switched-capacitor amplifier.

Using a gain stage 6 according to FIG. 8, connected to the output 50 of a photoreceptor circuit 5 such as depicted in FIG. 6 or 7, a photocurrent-dependent bandwidth limitation can be achieved. The gain stage then provides an automatic, photocurrent-controlled noise reduction by self-adjusting its bandwidth. The 3 dB frequency, which corresponds to the half power point, is proportional to the current $I_{Mg1}$ flowing through the first gain transistor Mg1:

$$f_{3dB} \sim I_{Mg1}$$

with the current $I_{Mg1}$ through the first gain transistor Mg1 depending on the voltage difference $V_{front}-V_{bias,ref}$. With first gain transistor Mg1 operating in the sub-threshold region, the 3 dB frequency is proportional to:

$$f_{3dB} \sim \frac{W_{Mg1}}{L_{Mg1}} I_{0,Mg1} e^{\frac{V_{front}-V_{bias,ref}}{n_{Mg1} \cdot V_t}}$$

With equally sized transistors for the first photoreceptor transistor Mp1 of the photoreceptor circuit 5 as in FIGS. 6 and 7 and for the first gain transistor Mg1 of the gain stage 6, and with a biasing reference voltage $V_{bias,ref}$ equal to the reverse voltage $V_D$ across the photodiode PD, it follows that the 3 dB frequency is proportional to the photocurrent $I_{ph}$:

$$f_{3dB} \sim I_{ph}$$

Since the reverse voltage $V_D$ across the photodiode PD is approximately independent of the photocurrent $I_{ph}$, the biasing reference voltage $V_{bias,ref}$ can be derived globally for all pixels in an array using a dummy circuit with a covered photodiode in a photoreceptor circuit such as the one of FIG. 6 or 7, with the output voltage of such a photoreceptor circuit used as the biasing reference voltage $V_{bias,ref}$.

The gain stage circuit 6 can thus replace a conventional source follower for effectively decoupling the sensitive front-end circuit 1 from the subsequent circuits, i.e. the transient detector circuit 2 and the exposure measurement circuit 3, and photocurrent-dependent bandwidth control and additional signal amplification can be achieved.

Figure 9:
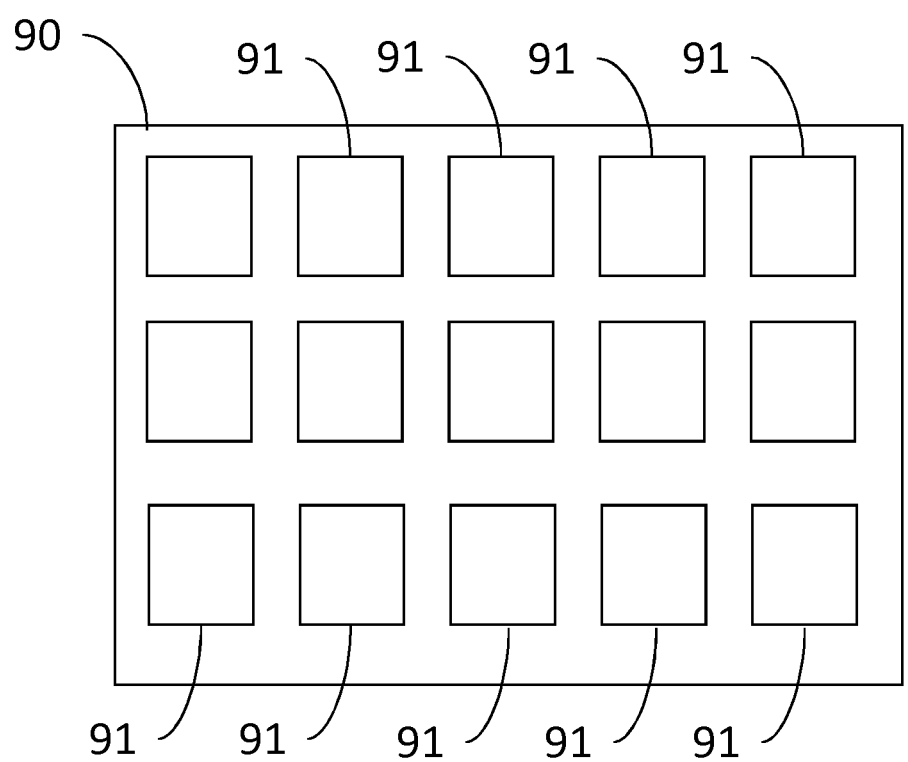
FIG. 9 shows an image sensor comprising a plurality of pixel circuits according to the invention.

FIG. 9 shows an image sensor 90 comprising a plurality of pixel circuits 91 according to possible embodiments of the invention as described above. The depicted pixel circuits 91 are arranged in an array.

The invention claimed is:

1. A pixel circuit comprising
a front-end circuit comprising a single photodiode and having an output, said front-end circuit being configured for delivering on said output a photoreceptor signal derived from a light exposure of said single photodiode;
a transient detector circuit configured for detecting a change in said photoreceptor signal delivered on said output;
an exposure measurement circuit configured for measuring said photoreceptor signal delivered on said output upon detection by the transient detector circuit of a change in the photoreceptor signal,
wherein the front-end circuit comprises a photoreceptor circuit connected to the single photodiode, the photoreceptor circuit comprises:
an output for delivering the photoreceptor signal derived from the light exposure of said single photodiode,
a first photoreceptor transistor having a drain and a gate, the gate of said first photoreceptor transistor being connected to the output of the photoreceptor circuit,
an additional photoreceptor transistor having a drain, a source and a gate, the drain of said additional photoreceptor transistor being connected to said single photodiode, and wherein said first photoreceptor transistor and said additional photoreceptor transistor have a common source.

2. The pixel circuit according to claim 1, wherein the exposure measurement circuit further comprises
an input connected to the output of the front-end circuit for receiving the photoreceptor signal,
a capacitor connected by a first switch to said input, said first switch being configured for disconnecting said capacitor from said input,
a source current in series with a second switch, parallel to said capacitor, said second switch being configured for controlling a discharge of said capacitor.

3. The pixel circuit according to claim 2, wherein the exposure measurement circuit comprises a voltage comparator having a signal input connected to one of the terminal of the capacitor and a reference input connected to a reference voltage (Vref).

4. The pixel circuit according to claim 2, wherein the voltage comparator has:

a signal input connected to one of the terminal of the capacitor and a reference input connected to reference switch configured for selectively connecting said reference input to at least two reference voltages.

5. The pixel circuit according to claim 1, wherein the transient detector circuit comprises:

an amplifier having two single-ended inverting common-source stages with capacitive feedback separated by a follower buffer, wherein a capacitor is charged by means of the photoreceptor signal, and at least one threshold detector is arranged to detect if a voltage over another capacitor ($C_4$) exceeds a threshold value.

6. The pixel circuit according to claim 1, wherein the gate of the additional photoreceptor transistor is biased by a biasing voltage or is connected to the common source of the first photoreceptor transistor and additional photoreceptor transistors.

7. The pixel circuit according to claim 1, wherein the front-end circuit further comprises a gain stage for amplifying the photoreceptor signal delivered on the output of the front-end circuit, said gain stage comprising an input connected to the output of a photoreceptor circuit, an output, a first gain transistor having a drain, a source and a gate, the gate of the first gain transistor being connected to the input of the gain stage, the source of the first gain transistor being connected to a biasing voltage and the drain of said first gain transistor being connected to the output of said gain stage, and a plurality of gain transistors in series, each gain transistor of the series having a drain, a source and a gate, each gain transistors of the series having its drain connected to its gate, and one of said plurality of gain transistors in series having its drain connected to the drain of the first gain transistor.

8. An image sensor comprising a plurality of pixel circuits, wherein each pixel circuit of said plurality of pixel circuits comprises:

a front-end circuit comprising a single photodiode and having an output, said front-end circuit being configured for delivering on said output a photoreceptor signal derived from a light exposure of said single photodiode;

a transient detector circuit configured for detecting a change in said photoreceptor signal delivered on said output;

an exposure measurement circuit configured for measuring said photoreceptor signal delivered on said output upon detection by the transient detector circuit of a change in the photoreceptor signal wherein the front-end circuit comprises a photoreceptor circuit connected to the single photodiode, the photoreceptor circuit comprises:

an output for delivering the photoreceptor signal derived from the light exposure of said single photodiode, a first photoreceptor transistor having a drain and a gate, the gate of said first photoreceptor transistor being connected to the output of the photoreceptor circuit, an additional photoreceptor transistor having a drain, a source and a gate, the source drain of said additional photoreceptor transistor being connected to said single photodiode, and wherein said first photoreceptor transistor and said additional photoreceptor transistor have a common source.

* * * * *